United States Patent [19]
Goff et al.

[11] Patent Number: 5,205,742
[45] Date of Patent: Apr. 27, 1993

[54] HIGH DENSITY GRID ARRAY TEST SOCKET

[75] Inventors: Jay Goff, Warwick, R.I.; Mark E. Lewis, Mansfield, Mass.

[73] Assignee: Augat Inc., Mansfield, Mass.

[21] Appl. No.: 804,127

[22] Filed: Dec. 6, 1991

Related U.S. Application Data

[63] Continuation-in-part of Ser. No. 748,505, Aug. 22, 1991.

[51] Int. Cl.[5] .............................................. H01R 9/09
[52] U.S. Cl. ...................................... 439/73; 439/331; 439/525
[58] Field of Search ....................... 439/66, 70, 72, 73, 439/259, 261, 264, 266, 330, 331, 342, 525, 526

[56] References Cited

U.S. PATENT DOCUMENTS

| | | | |
|---|---|---|---|
| Re. 32,370 | 3/1987 | Bright et al. ............... | 439/331 X |
| 4,222,626 | 9/1980 | Hollyday et al. ............. | 439/525 |
| 4,354,720 | 10/1982 | Bakermans . | |
| 4,358,175 | 11/1982 | Reid ......................... | 439/331 |
| 4,504,105 | 3/1985 | Barkus et al. . | |
| 4,511,196 | 4/1985 | Schuler et al. .............. | 439/65 X |
| 4,513,353 | 4/1985 | Bakermans et al. ........... | 439/71 X |
| 4,636,026 | 1/1987 | Cooney et al. . | |
| 4,679,118 | 7/1987 | Johnson et al. .............. | 361/386 |
| 4,758,176 | 7/1988 | Abe et al. ................... | 439/331 |
| 4,761,140 | 8/1988 | Geib ......................... | 439/71 |
| 4,838,801 | 6/1989 | Bertoglio et al. ............ | 439/83 |
| 4,906,194 | 3/1990 | Grabbe ....................... | 439/608 X |
| 4,918,513 | 4/1990 | Kurose et al. ............... | 439/71 X |
| 4,928,199 | 5/1990 | Diaz et al. .................. | 361/56 |
| 4,929,194 | 5/1990 | Korsunsky et al. ............ | 439/571 |
| 4,961,709 | 10/1990 | Noschese ..................... | 439/245 X |
| 5,073,116 | 12/1991 | Beck, Jr. .................... | 439/331 X |

*Primary Examiner*—Larry I. Schwartz
*Assistant Examiner*—Khiem Nguyen
*Attorney, Agent, or Firm*—Weingarten, Schurgin, Gagnebin & Hayes

[57] ABSTRACT

A high density land grid array test socket comprises a leadless component contact socket assembly and a fixture. The contact socket assembly can be assembled with a variety of contact terminal end configurations and adapted for a desired mode of circuit board interface. In one embodiment, the test socket fixture includes a latching mechanism and a hinged lid assembly which allow quick and reliable manual installation of a device under test (DUT). An alternative embodiment includes snap latches, extension springs and alignment bushings which permit robotically controlled insertion and removal from the test socket. A bias clip or spring is incorporated in the test sockets for assuring proper alignment of the chip carrier with the contact socket assembly. The test socket creates reliable contacts with short electrical paths for low signal distortion and reduced chip loading.

20 Claims, 12 Drawing Sheets

5,205,742

HIGH DENSITY GRID ARRAY TEST SOCKET

This application is a continuation-in-part of U.S. patent application Ser. No. 07/748,505, filed Aug. 22, 1991.

FIELD OF THE INVENTION

The present invention relates to electronic component sockets, and in particular to a high density land grid array test socket.

BACKGROUND OF THE INVENTION

Leadless chip carrier sockets are known for removably socketing leadless chip carriers or packages which have no protruding electrical leads but which have contact sites or pads to which electrical contact must be made. However, such known leadless chip carrier sockets are not satisfactory in terms of contact reliability, especially where sophisticated packaging results in increasing pin densities and consequently in greater numbers of contacts.

Former technology used plated through-holes or surface mounted IC chips soldered directly to the board. With today's density of chip carriers, these techniques are not easy to achieve. If an IC chip becomes defective, replacing a soldered chip becomes more difficult than using a socket. Plastic IC chip carriers with high pin count have relatively small leads that are more difficult to solder to a printed circuit board. Extra cost is added to protect IC chip carriers during handling and transportation.

Today's high numbers of closely spaced contacts make it important to protect the leads of the IC chip carrier to maintain their proper position. Damage or misalignment of the chip carrier leads can cause an unreliable electrical connection. With higher speeds of systems, the chip carriers require shorter lead lengths to reduce capacitance and inductance. Current package styles may have no leads. Thus, difficulties arise in socketing leadless components in printed circuit boards and in test fixtures.

As it is very difficult to remove high density leadless chip carriers that have been installed on a printed circuit board, it is desirable to socket such devices, prior to installation, to exercise internal circuitry A suitable socket is needed for functional and accelerated life testing.

SUMMARY OF THE INVENTION

The present invention is a high density land grid array test socket. The test socket generally comprises a leadless component contact socket assembly and a fixture. The contact socket assembly can be assembled with a variety of contact terminal end configurations and adapted for a desired mode of circuit board interface. In one embodiment, the test socket fixture includes a latching mechanism and a hinged lid assembly which allow quick and reliable installation of a device under test (DUT). An alternative embodiment includes snap latches, extension springs and alignment bushings which permit robotically controlled insertion and removal from the test socket. A bias clip or spring is incorporated in the test socket for assuring proper alignment of the chip carrier with the contact socket assembly.

Features of the invention include reliable contacts with short electrical paths for low signal distortion and reduced chip loading.

DESCRIPTION OF THE DRAWING

These and other features and advantages of the present invention will become apparent in light of the following detailed description of an illustrative embodiment thereof, as illustrated in the accompanying drawing, of which.

DETAILED DESCRIPTION OF THE INVENTION

Figure 1:
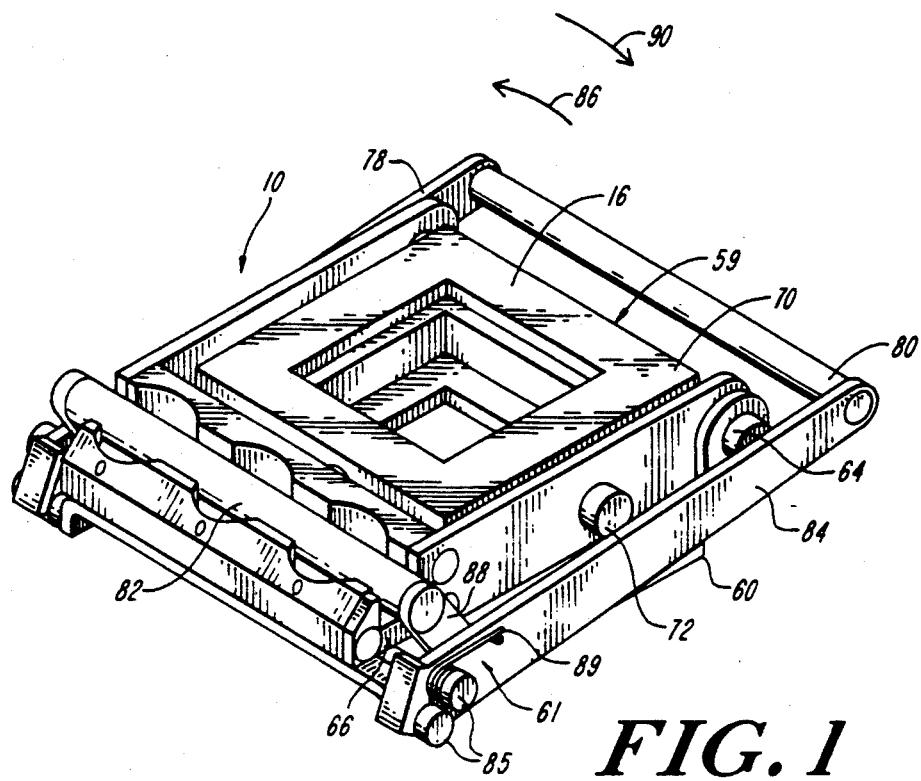
FIG. 1 is a perspective view of a high density test socket having a manual quick release latching mechanism.
Figure 2:
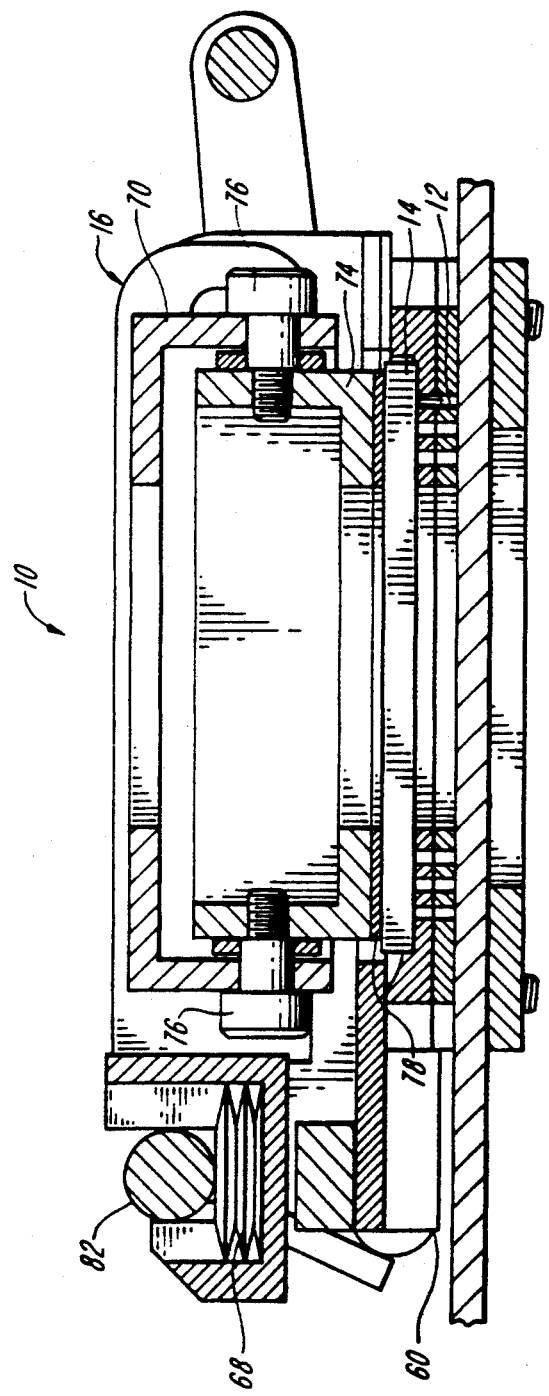
FIG. 2 is a side section view of the test socket of FIG. 1.

A leadless component test socket 10, as illustrated in FIGS. 1 and 2, generally comprises a leadless component contact socket assembly 12 which accommodates a leadless chip carrier 14 which is maintained in contact with the contact socket assembly 12 by a cover 16.

Figure 2A:
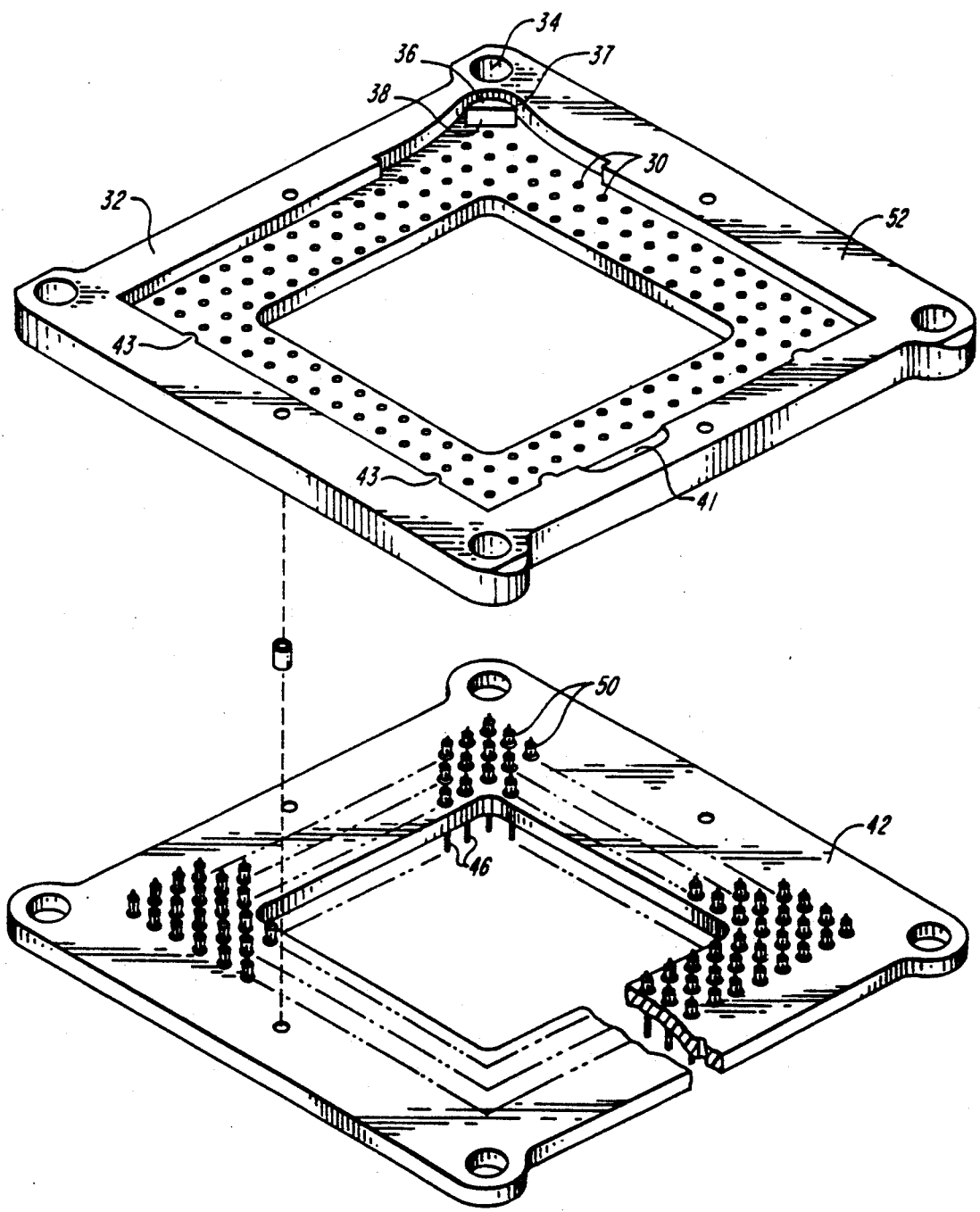
FIG. 2A is a perspective view of a leadless component contact socket assembly of the socket of FIG. 1.
Figure 2B:
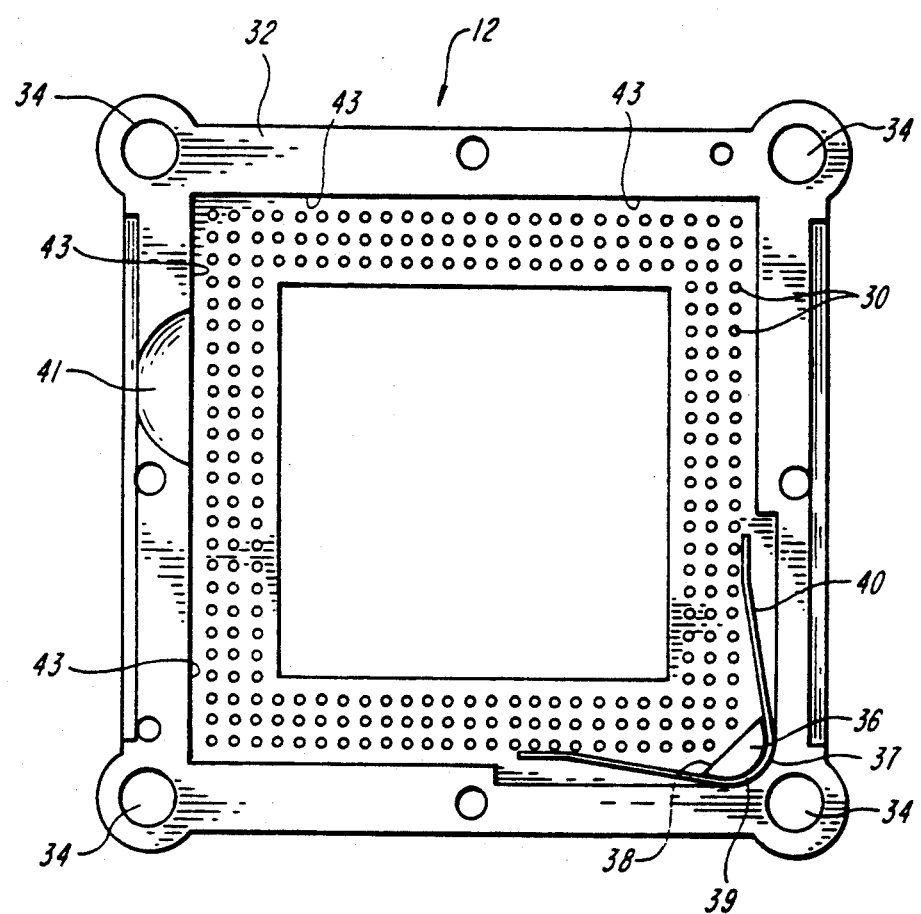
FIG. 2B is a top view of the leadless component contact socket assembly of FIG. 2A.

As illustrated in FIGS. 2A and 2B, the leadless component contact socket assembly 12 comprises an array of openings that contain respective two-piece spring contacts, such as described in Bertoglio et al, U.S. Pat. No. 4,838,801 which is incorporated herein by reference. The contact socket assembly 12 comprises an outer frame 32 which is substantially rectangular. A keyed corner piece 36 is integral to the raised outer frame 32 and disposed in one corner as a substantially semicircular member separated from the raised frame 32 by a substantially semicircular channel 37. The top portion of the keyed corner 36 is substantially coplanar with the raised frame 32. An interior surface 38 of the corner 36 serves as an alignment surface for aligning a leadless chip carrier for proper disposition within the contact socket assembly 12. Frame 32 is further provided with a depression 39 about midpoint of the channel 37. The channel 37 and depression 39 accommodate a 14 bias clip 40, such as is illustrated and discussed in detail in the referenced application. The raised frame 32 can also be provided with at least one finger slot 41 which is a depression along an edge of raised frame 32 that permits access to a side of a leadless chip carrier resident in the contact socket assembly, to facilitate fingertip removal of the chip carrier therefrom.

The contact socket assembly 12, as illustrated in FIGS. 2A, 2B and 3A-3C, comprises an insulative base 42 having an array of base openings 44 conforming to the terminal pattern of a leadless chip carrier to be retained in the socket. The base openings 44 accommodate a plunger base 46 which is maintained in the opening by a shoulder 48 that prevents passage of the plunger base 46 through the base opening 44. A contact tip 50 engages the plunger base 46 to effect a spring contact as described in detail in the referenced '801 patent. A top insulative portion 52 having a corresponding array of top openings 54 is disposed on insulative base 42 to form the contact socket assembly 12. The top insulative portion 52 has a plurality of holes 56 integral with the top openings 54 through which the contact tips 50 protrude in the array conforming to the terminal pattern of the device to be retained in the socket.

A variety of contact terminal patterns can be configured in the contact socket assembly by including or excluding contact terminals from selected holes. Further, a variety of types of contact terminals can be configured for a variety of modes of interfacing the socket assembly 12 with a printed circuit board. Plunger bases 46 are illustrated for configuration with printed 14 circuit boards in compression, surface mount and plated through-hole interface modes as in FIGS. 3A, 3B and 3C, respectively.

Figure 3A:
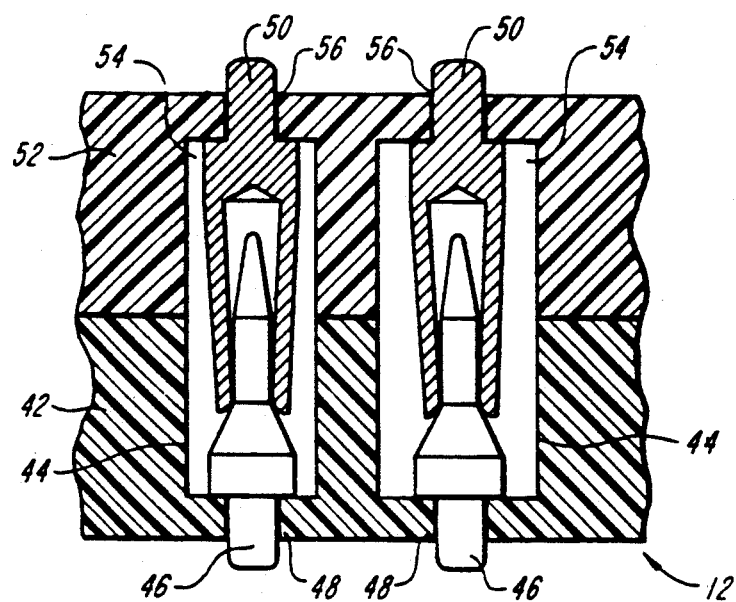
FIGS. 3A, 3B and 3C are side section views of the contact 19 socket assembly of FIG. 2A having compression, surface mount and through-hole mode terminals disposed therein, respectively.
Figure 3B:
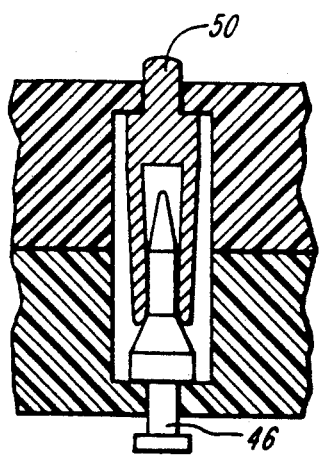
Figure 3C:
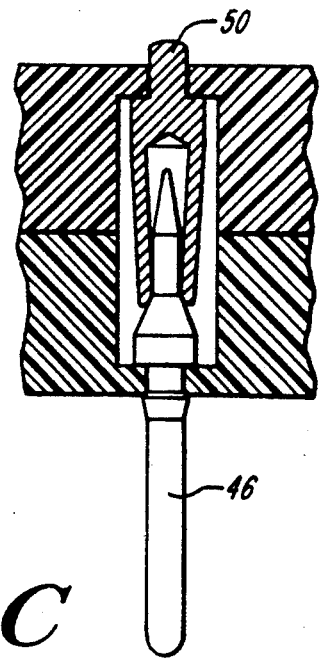
Figure 3D:
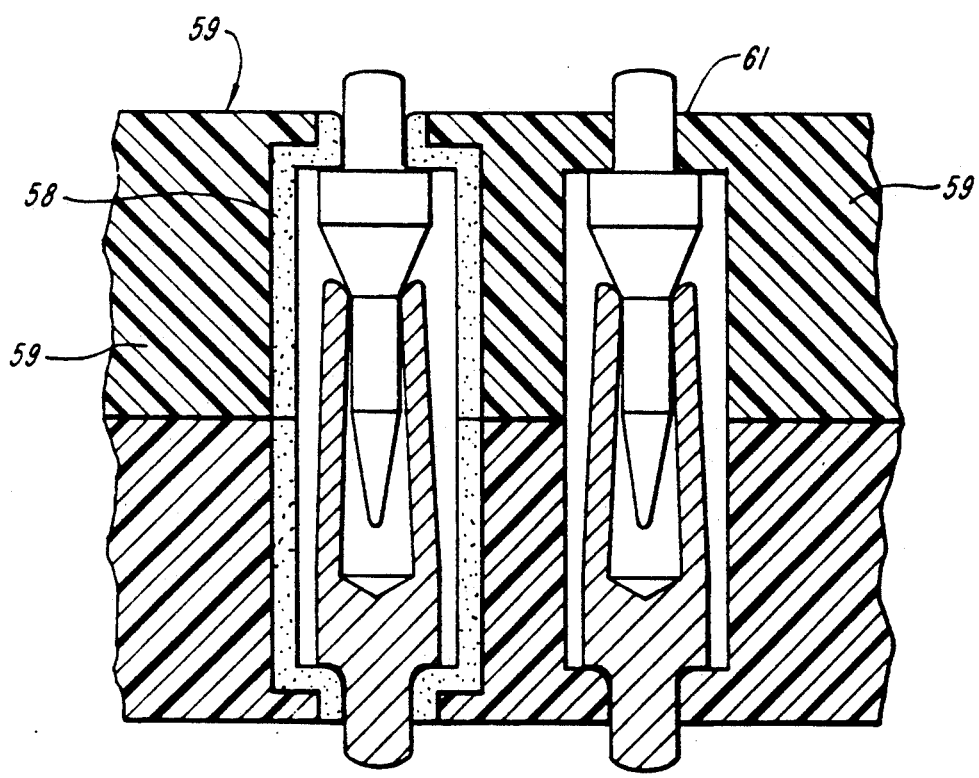
FIG. 3D is a side sectioned view of an embodiment of a leadless component contact socket assembly having a dielectric cavity high speed transmission line environment.

Further, the contact socket assembly openings, as illustrated in FIG. 3D, can be provided in a conductive material 59 with a coaxial insulator 58, forming a dielectric cavity in which the contact tip 50 and selected plunger base 46 are enclosed. The dielectric on the interior of the base opening 44 and the top portion opening 54 can be formed of various insulative or dielectric materials or coatings such as polytetrafluoroethylene, nylon, FR4 or the like. Signal integrity is enhanced by creating a transmission line environment for high speed, fast rise time signals. The thickness and/or composition of the dielectric in the cavity can be controlled to obtain desired impedance and/or crosstalk limiting characteristics. While a first contact terminal receptacle is configured with the dielectric cavity for high speed signal transmission, an adjacent cavity 61 is configured without the dielectric to act as a ground/return.

Figure 3E:
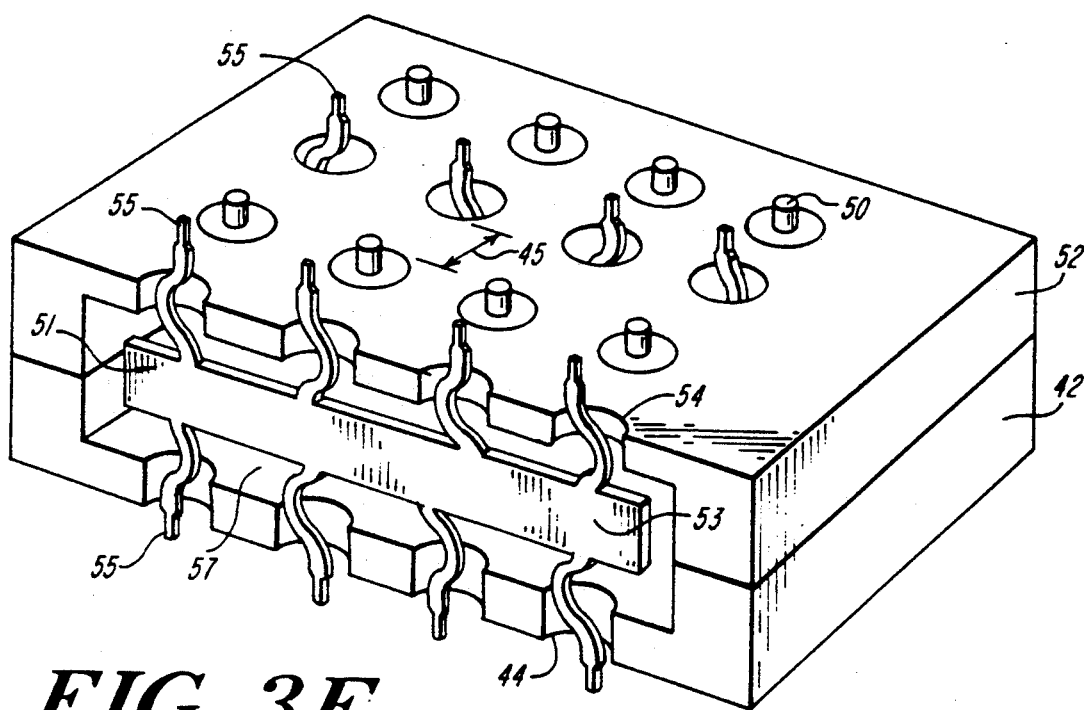
FIG. 3E is a perspective sectioned view of an embodiment of a leadless component contact socket assembly having a high speed transmission line environment implemented using a compliant bus bar.

FIG. 3E illustrates an alternative transmission line environment implementing another signal integrity enhancement method that can be made to the interconnection socket applications described herein. This method employs a compliant ground/power bus bar approach. The compliant ground/power bus bar 51 will provide a transmission line environment in the interconnection application of high speed, fast rise time signals. This transmission line environment is created by placing a compliant ground/power bus bar in parallel with a row of signal carrying contact tips 50. The compliant bus bar 51 comprises a bus bar 53 having a plurality of compliant contacts 55. The bus bar 53 is disposed within a cavity 57 constructed in the insulative base 42 and the top insulative portion 52 so that compliant contacts 55 extend from the respective base opening 44 and top insulative portion opening 54. A space 45 between the compliant ground/power bus bar and the row of signal carrying contacts can be adjusted to obtain the desired impedance and/or cross talk limiting characteristic. This compliant ground/power bus bar provides a ground reference plane or a power plane that will carry current from the IC chip carrier/multi-chip module substrate to and from the printed circuit board.

Alignment of a leadless component carrier 14 within the contact socket assembly 12, and maintenance of compressive forces on the carrier 14 to ensure electrical interconnection between the carrier and the array of contact tips 50, in a test socket having a manual quick release/latch mechanism, is effected by a combination of the bias clip 40 and the test socket cover 16.

Figure 4:
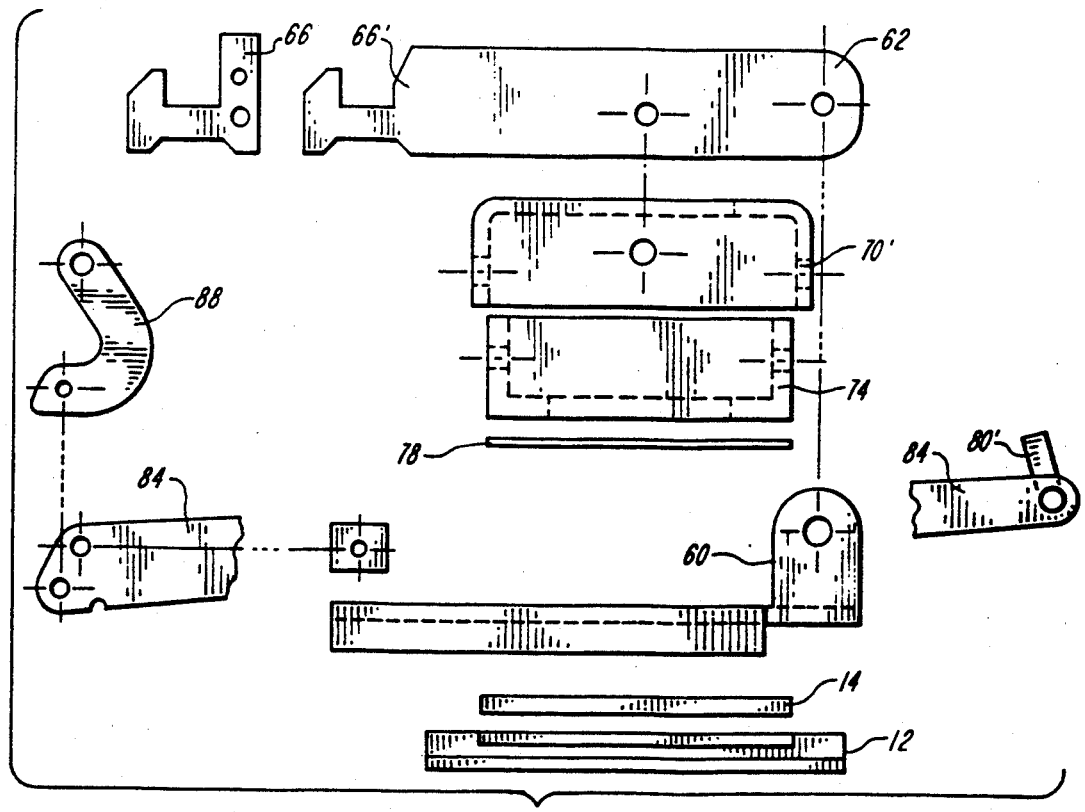
FIG. 4 is an exploded view of a hinged lid assembly and latching mechanism of the test socket of FIG. 1.

The test socket cover 16, as shown in FIGS. 1, 2 and 4, includes a hinged lid assembly 59 and latching mechanism 61 attached to a base plate 60 which provides the main structural framework for the test socket 10. The hinged lid assembly 59 includes two side plates 62 forming beams that run along the side of the test socket 10. The side plates 62 are hinged 64 to the base plate 60 at one end of the test socket. At an opposite end the side plates 62 are fixed to a spring support 66 disposed transversely between the side plates 62. Alternatively, the side plates 62 have an integral spring support 66, (FIG. 4). In either case, the spring support functions as a structural member within the hinged lid assembly 59 and houses compliant springs 68 (FIG. 2) which work in conjunction with the latching mechanism discussed hereinafter.

The hinged lid assembly includes a full motion gimbal which comprises an outer gimbal 70 pivotably mounted 72 to the side plates 62 slightly off center between the spring support 66 and the side plate/base plate hinge(s) 64. An inner gimbal 74 is disposed within the outer gimbal 70 and is pivotable about an axis formed by fasteners, such as screws 76, perpendicular to a pivot axis of the outer gimbal formed by the pivotable mount 72 to the side plates 62. A surface of the inner gimbal 74 nearest the device 14 under test (DUT) is provided with a thin rubber backing 78 or other insulative cushion material. The outer and inner gimbals pivot independently of each other providing a full rotational freedom which enables the hinged lid assembly 59 to distribute forces evenly onto the DUT.

The hinged lid assembly 59, best illustrated in FIGS. 1 and 4, maintains a DUT securely installed within the test socket 10 and in alignment with the plurality of contacts of the contact socket assembly 12 via a latching mechanism 61. The latching mechanism 61 includes a lever handle 80 and a latch rod 82 The lever handle 80 is attached to a pair of side levers 84 which, when the lid assembly is in the closed position, are substantially parallel to the side plates 62, thus reducing overall test socket size. To release the latch mechanism, the lever handle 80 is manually actuated in a first direction 86 with a rotational movement upwardly about fastener 85 attached to base 60, thus removing the evenly distributed forces being applied to the DUT, permitting removal of the DUT. The side levers 84, during release, are elevated at a first end proximate to and attached to the lever handle 80. An opposing second end of each of the side levers 84 is attached to a link member 88 which is in turn attached to the latch rod 82. The upward rotational movement of the side lever first ends, upon elevation of the lever handle 80, is translated into a vertical actuation of the latch rod 82, lifting latch rod 82 and relieving normal forces applied to compliant springs 68. As the lever handle 80 approaches the top of its arc in the rotational movement, the latch rod 82 is lifted from the compliant springs held within the spring support 66 and descends down a backside thereof to facilitate lifting of the cover 16 including the side plates 62 and inner and outer gimbals, permitting access for removal of the DUT. A torsional spring component 89 assures that the latching mechanism comprised of link member 88 and latching rod 82 remain in the normally open position (i.e. spread open).

Actuating the lever handle 80 in a second direction 90 returns the latch rod 82 to the spring support 66 exerting a normal force onto the compliant springs 68 housed in the spring support 66. The compliant springs 68 are compressed as a result of the downward force. This force is transmitted onto the spring support 66 through to the side plates 62. The side plates 62 amplify the load and at the pivotable mount 72 the amplified load is transferred onto the outer and inner gimbals. The inner gimbal 74 applies an evenly distributed load onto the DUT which depresses the contacts of the socket assembly 12, discussed hereinbefore.

The compliant springs 68 have a deflection range that is capable of producing the required forces to depress all of the contacts while allowing for varying thickness in the DUT.

Figure 5:
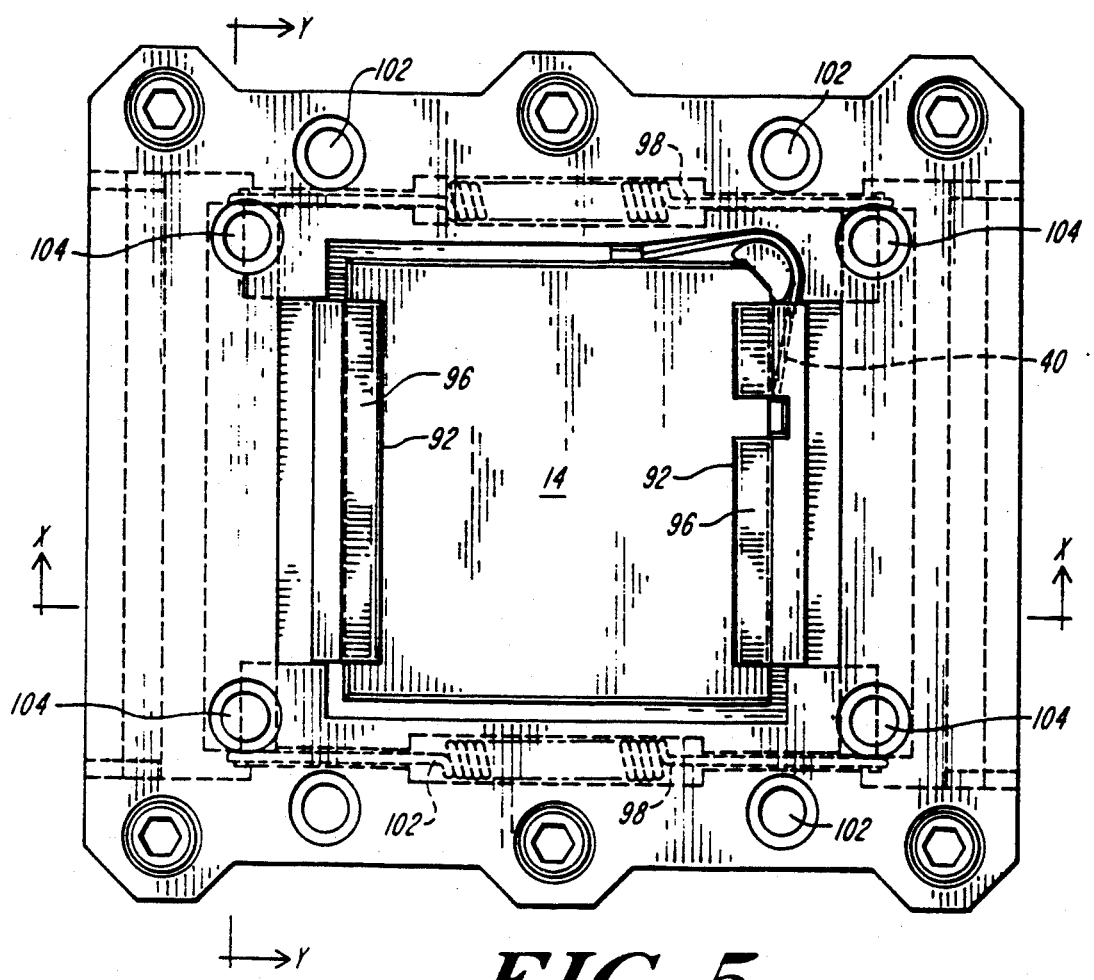
FIG. 5 is a top view of a test socket according to the invention having snap latches, extension springs and alignment bushings for robotically controlled insertion and extraction of a device under test.
Figure 5B:
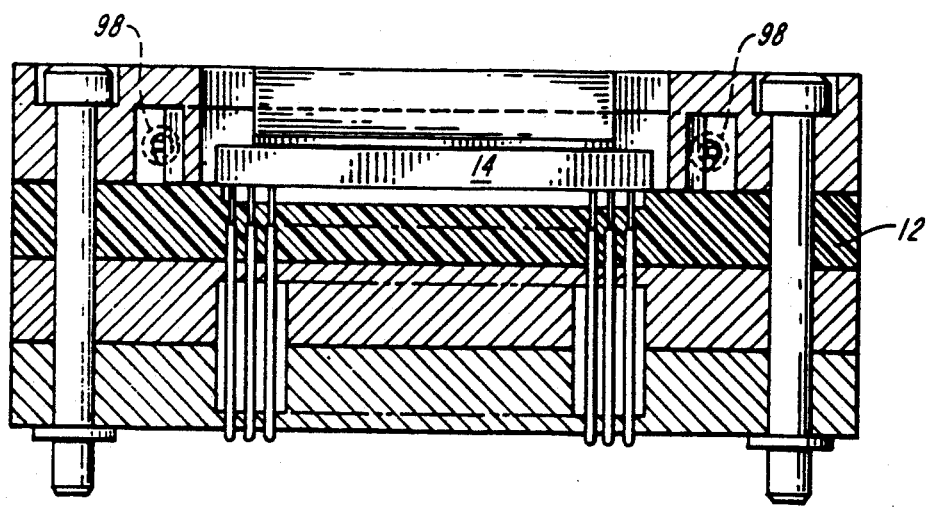
FIG. 5B is a side sectioned view of the test socket of FIG. 5 taken along a line Y—Y.
Figure 5A:
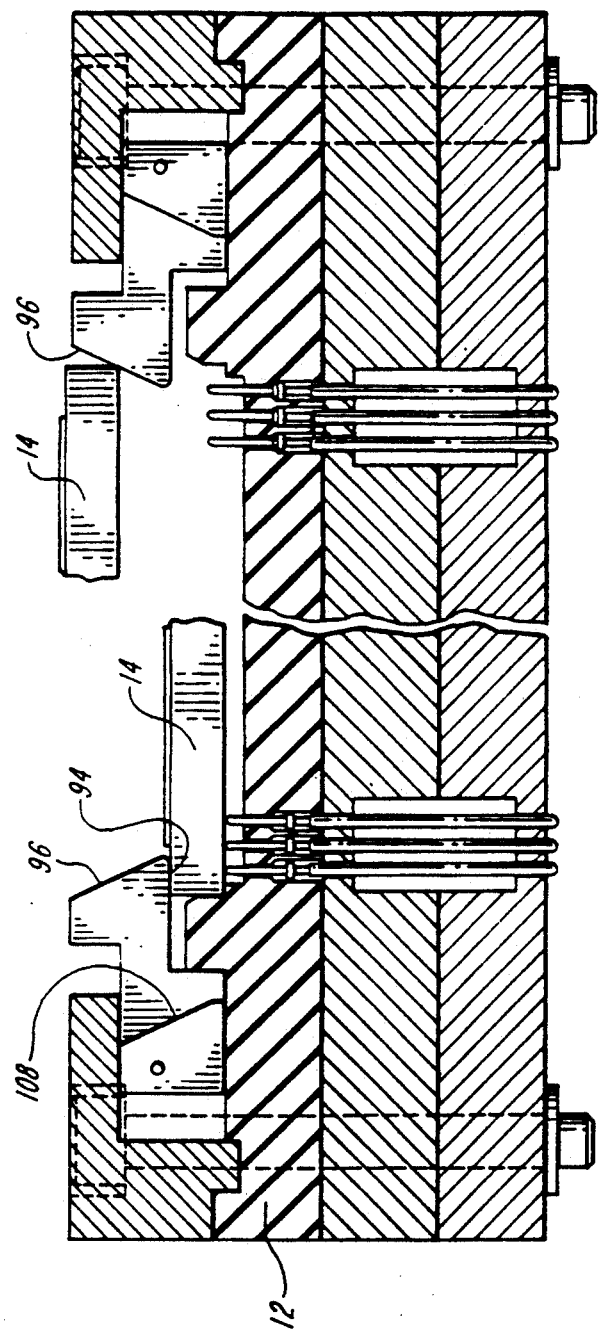
FIG. 5A is a side sectioned view of the test socket of FIG. 5 taken along a line X—X.

Alternatively, the test socket according to the invention has a cover 99 assembly which facilitates robotically controlled insertion and extraction of a DUT to provide functional and burn-in test environments at high production volumes. The test socket cover works in conjunction with high volume mass production equipment to facilitate insertion and extraction of a device under test, to and from the test socket. As illustrated in FIGS. 5, 5A and 5B, this embodiment of the test socket includes a plurality of snap latches 92 disposed in opposed pairs. In this illustrative embodiment, two snap latches 92 are disposed above the contact socket assembly 12 so that a DUT fits snugly beneath a bottom surface 94 of the snap latches, in good electrical contact with the underlying array of contacts. The snap latches 92 have inclined surfaces 96 acting as lead-in angles which engage edges of the device being installed into the test socket. In addition to the inclined surface 96, the snap latches have a second set of internal inclined surfaces 108 disposed at the ends. The internal surfaces 108 are used during the extraction of the DUT where the 15 alignment/release pins work in conjunction with these surfaces to open the snap latches, as discussed hereinafter. Extension springs 98 are attached to each of the opposed snap latches 92 at extreme ends thereof and maintain the snap latches 92 in a normally closed position. A cover 100 accommodates a plurality of insertion bushings 102 and extraction bushings 104, which facilitate alignment of alignment/release pins 106 on mass production equipment with the test socket.

Figure 6:
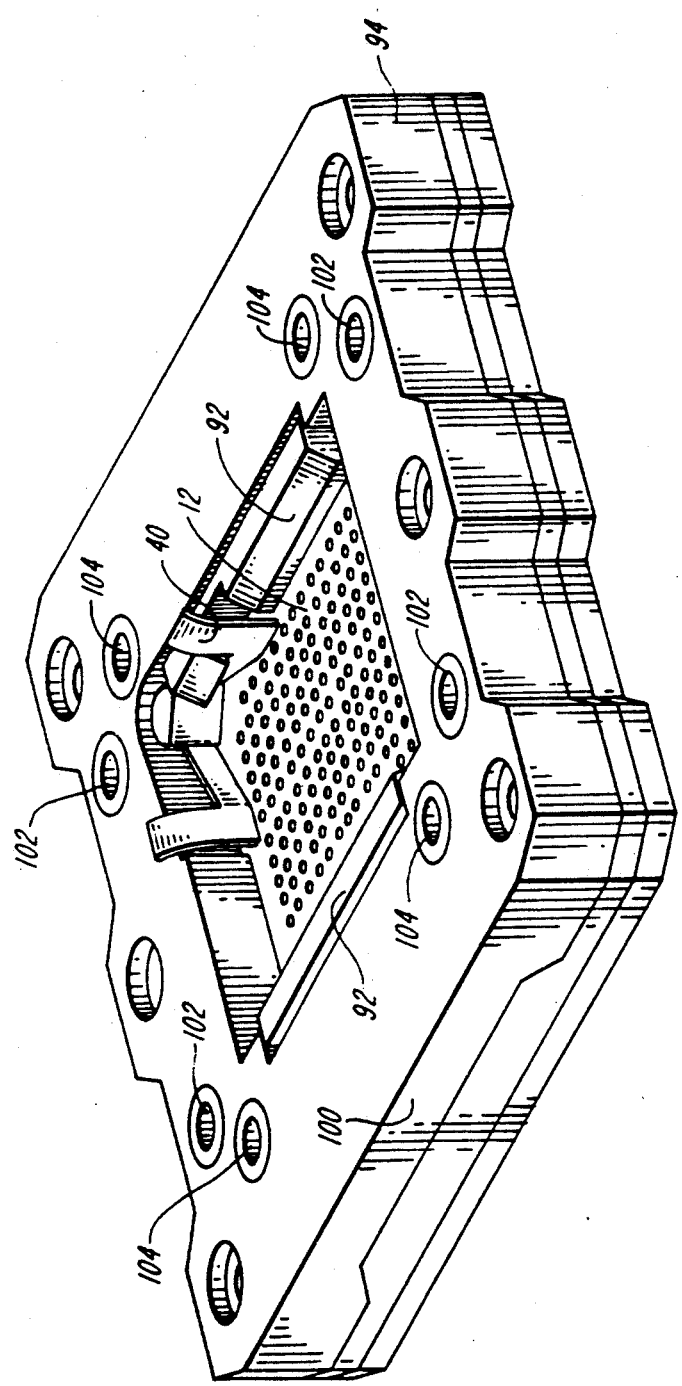
FIG. 6 is a perspective view of the test socket of FIG. 5.
Figure 6A:
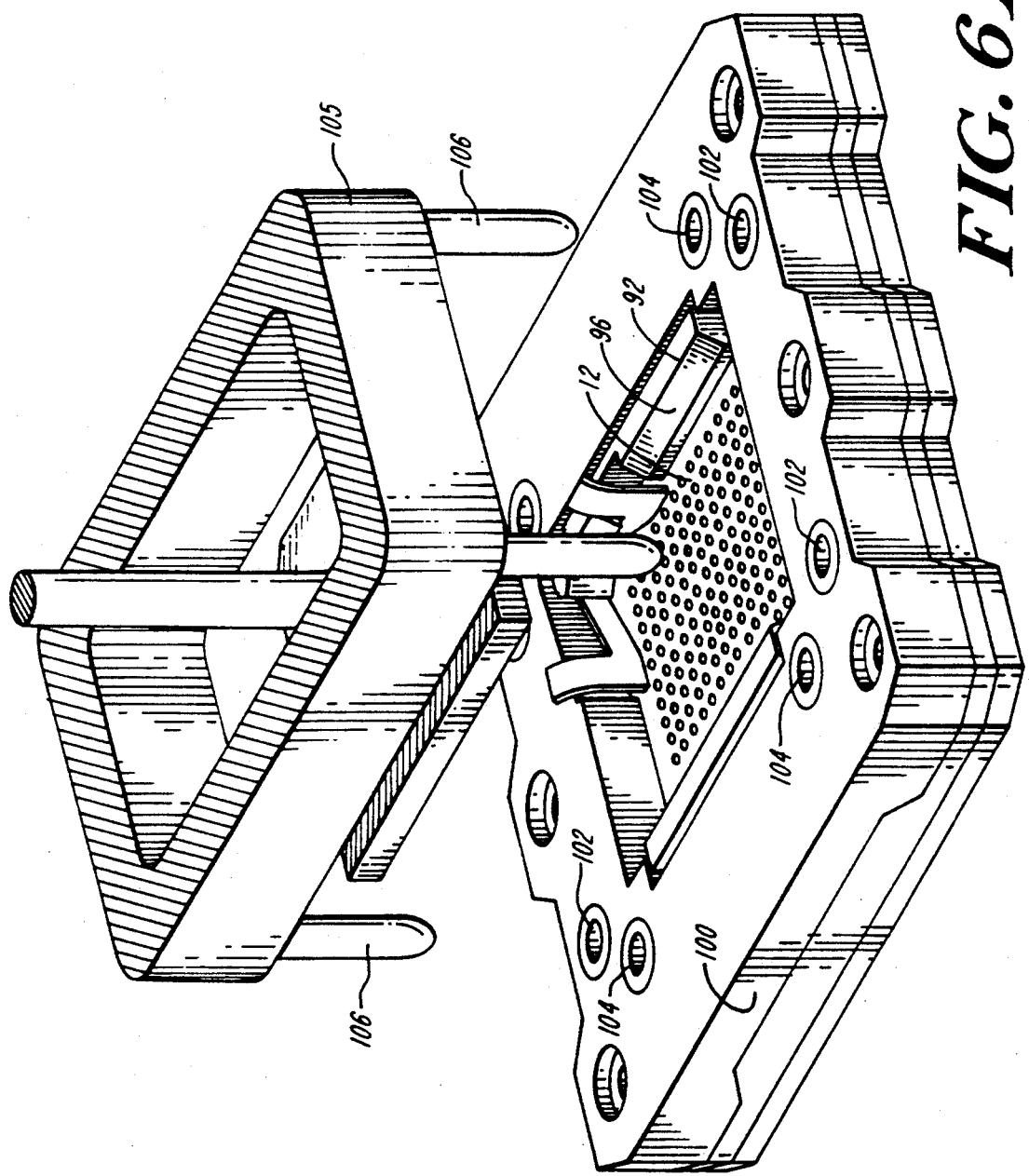
FIG. 6A illustrates robotically controlled installation of a device into the test socket of FIG. 5.
Figure 6B:
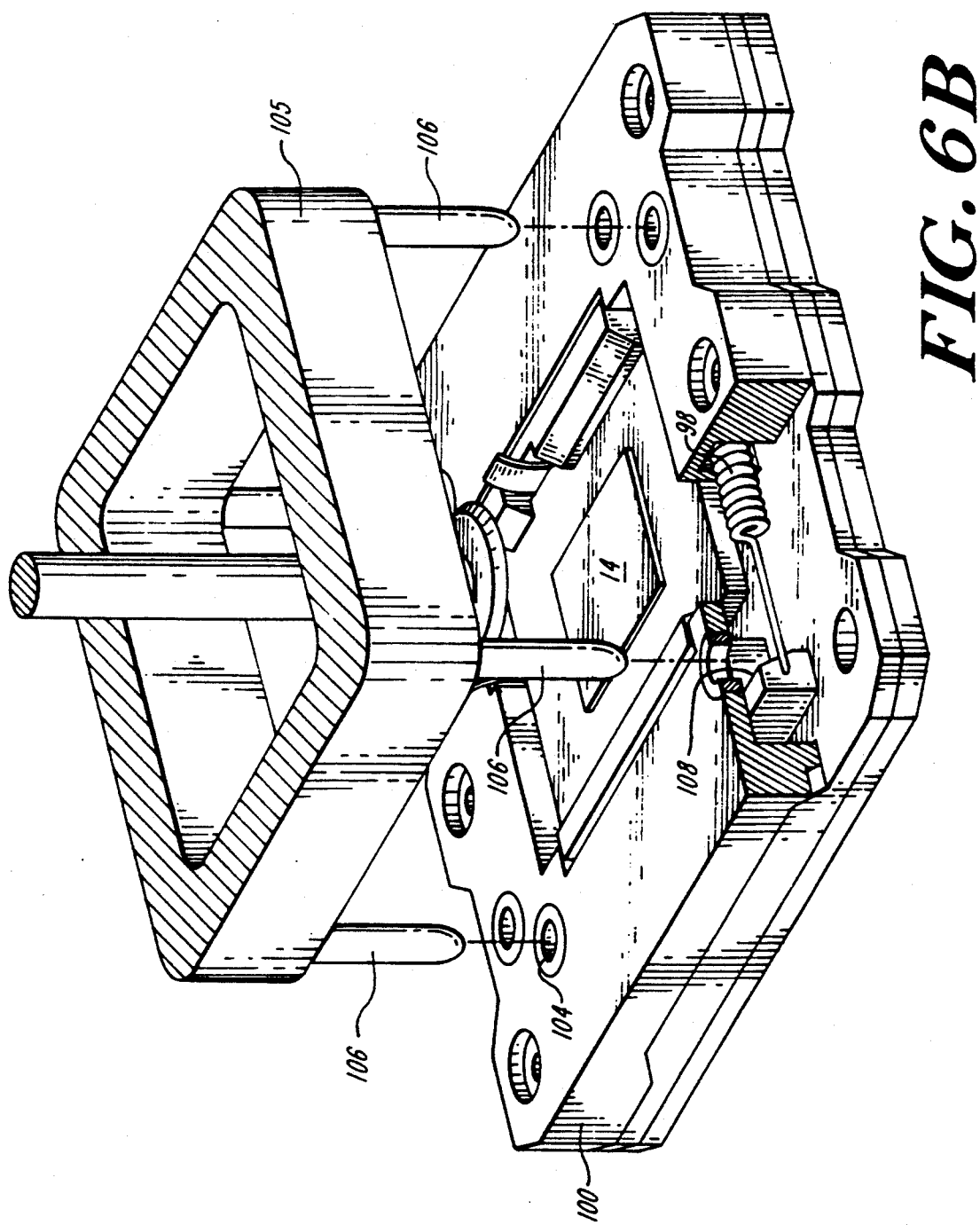
FIG. 6B illustrates robotically controlled extraction of a device from the test socket of FIG. 6.

As illustrated in FIGS. 6, 6A and 6B, a device under test 14 can be inserted into or extracted from the test socket with a continuous vertical motion. The mass production equipment loading apparatus 105 used for insertion and extraction of the DUT must be fitted with alignment/release pins 106, as shown in FIGS. 6A and 6B. The alignment/release pins 106 provide, among other things, proper alignment between the mass production equipment loading apparatus 105 and the test socket.

During insertion, as illustrated in FIG. 6A, the alignment/release pins 106 align with insertion bushings 102 which act as guide bushings to guide the loading apparatus 105 and which, in conjunction with the bias clip 40, assure proper orientation of the DUT in the test socket. As the loading equipment descends with the DUT, the alignment/release pins engage the insertion bushings 102 and edges of the DUT engage the inclined surface lead-in angles 96 of the snap latch 92. A small insertion force of the loading apparatus overcomes a slight resistance provided by the extension springs 98 and causes the snap latches 92 to spread, allowing the device to pass and rest on the contact surface of the contact socket assembly 12. The bias clip 40 guides the device, critically aligning it with the contacts of the contact socket assembly. When the device is beyond the bottom surface 94 of the snap latches, the snap latches return to the normally closed position, securing the DUT within the contact socket assembly. After installation, the loading apparatus 105 releases the device and the loading apparatus is removed.

Extraction of the device, as illustrated in FIG. 6B, is accomplished using a similar continuous vertical motion. For extraction the alignment/release pins 106 must be rotated ninety degrees from their position during insertion, so that the alignment/release pins are aligned with the extraction bushings 104. The alignment/release pins 106 of the loading apparatus 105 pass through the extraction bushings 104 in the cover 100 and engage at least one internal inclined surface 108 on each of the snap latches 92. The interior inclined surface 108, in this illustrative embodiment, is disposed proximate to the ends of the snap latch 92 and is proximate to an end of the extension spring 98 which is attached to a respective end of the snap latch 92. As the loading apparatus 105 descends the alignment/release pins 106 engage the interior inclined surfaces 108 and cause the snap latches to spread, freeing the device. A mechanical or vacuum grip, as known in the art, is applied and the device is lifted from the test socket.

Although it is described that the alignment/release pins of the loading equipment must be rotated ninety degrees to accomplish extraction, it will be appreciated that alternatively, the loading equipment can be fitted with a plurality of alignment release pins that engage as required or with retractable alignment release pins which actuate the snap latch and related mechanisms in accordance with the desired mode.

Although several embodiments of covers are disclosed herein, various other cover embodiments can be employed to suit specific operational requirements.

While the contact socket assembly herein is described as having a raised outer frame 32 and the keyed corner 36 which are rectangular and semicircular, respectively, it can be appreciated that alternative geometries and dimensions can be implemented.

Although the test socket is described and illustrated having a bias clip and keyed corner in the same corner for chip alignment, it can be appreciated that the clip could be in one corner while the key for chip polarization could be in a separate corner.

While these and other pieces, as are the latch rod 82 and link member 88, it can be appreciated that these and other pieces described separately, can be fabricated as integral components performing the described functions.

Although the invention has been shown and described with respect to illustrative embodiments thereof, it should be understood by those skilled in the art that the foregoing and various changes, omissions and additions in the form and detail thereof may be made without departing from the spirit and scope of the invention as delineated in the claims.

What is claimed is:

1. A high density contact test socket comprising:
   a contact socket assembly having an insulative portion, said insulative portion having a plurality of holes disposed therein;
   a plurality of resilient contacts disposed in at least some of said plurality of holes, said plurality of resilient contacts comprising a contact tip and a contact base;
   a cover adapted to be disposed on said contact socket assembly and adapted for applying sufficient pressure on a component installed in said contact socket assembly, said cover being adapted for manual actuation and comprising a hinged lid assembly engaging a base plate supporting said contact socket assembly, said hinged lid assembly comprising a plurality of side plates hinged to said base plate at a first end of said side plates, a full motion 2-axis gimbal, said 2-axis gimbal comprising an outer gimbal and an inner gimbal, said inner gimbal rotatably hinged along a first axis to said outer gimbal, said outer gimbal rotatably hinged along a second axis to said plurality of side plates; and
   a latch mechanism for latching said cover to maintain said component in electrical engagement with said plurality of resilient contacts;
   wherein said latch mechanism comprises a plurality of side levers fastened to said base plate by a fastener at a first end and a lever handle attached to at least one of said plurality of side levers at a second end, said plurality of side levers each having a link member attached thereto proximate to said first end and said link members having a latch rod attached therebetween whereby rotational motion of said level handle about said fastener is translated into a vertical motion imparted to said latch rod via said link members.

2. The high density contact test socket of claim 1 wherein each of said plurality of side plates includes an integral spring support located at a second end thereof.

3. The high density contact test socket of claim 1 wherein said inner gimbal is rotatably hinged along said first axis which is orthogonal to said second axis.

4. The high density contact test socket of claim 2 wherein said latch mechanism further comprises at least one compliant spring disposed in a spring support.

5. A high density contact test socket comprising:
   a contact socket assembly having an insulative portion, said insulative portion having a plurality of holes disposed therein;
   a plurality of resilient contacts disposed in at least some of said plurality of holes, said plurality of resilient contacts comprising a contact tip and a contact base;
   a cover adapted to be disposed on said contact socket assembly and adapted for applying sufficient pressure on a component installed in said contact socket assembly;
   a latch mechanism for latching said cover to maintain said component in electrical engagement with said plurality of resilient contact;
   wherein said cover comprises a hinged lid assembly engaging a base plate supporting said contact socket assembly, said hinged lid assembly comprising a plurality of side plates hinged to said base plate along said side plates, a full motion two-axis gimbal, said two-axis gimbal comprising an outer gimbal and an inner gimbal, said inner gimbal rotatably hinged along a first axis to the outer gimbal, the outer gimbal rotatably hinged along a second axes to said plurality of side plates, the first and second axis being generally orthogonal to each other to provide said full motion two-axis gimbal.

6. The high density contact test socket of claim 5 wherein said contact socket assembly is adapted for receiving at least one leadless component package.

7. The high density contact test socket of claim 5 wherein said contact base of said plurality of resilient contacts is adapted for surface mount interconnection with a printed circuit board.

8. The high density contact test socket of claim 5 wherein said contact base of said plurality of resilient contacts is adapted for compression interconnection with at least one printed circuit board conductor.

9. The high density contact test socket of claim 5 wherein said contact base of said plurality of resilient contacts is adapted for through-hole interconnection with at least one printed circuit board conductor.

10. The high density contact test socket of claim 5 wherein at least some of said plurality of holes comprise a means for creating a high speed transmission line environment.

11. The high density contact test socket of claim 5 wherein said contact socket assembly further comprises a biasing means for maintaining alignment of a plurality of electrical connections on a component installed in said contact socket assembly and said contact tips.

12. The high density contact socket of claim 11 wherein said biasing means comprises a resilient biasing clip.

13. The high density contact socket of claim 5 wherein said contact socket assembly further comprises an integral means for ensuring a particular orientation of a component installed in said contact socket assembly.

14. The high density contact socket of claim 13 wherein said integral means for ensuring a particular orientation comprises a keyed corner of said insulative portion of said contact socket assembly.

15. The high density contact socket of claim 5 wherein said insulative portion further comprises means enabling access to a component installed in said insulative portion therefrom.

16. The high density contact socket of claim 15 wherein said means for enabling access to comprises a depression which facilitates access to a side of said component.

17. The high density contact socket of claim 5 wherein at least some of said plurality of holes are lined with a dielectric material that is surrounded by a conductive material and adapted for receipt of contact means for high speed signal transmission.

18. The high density contact socket of claim 5 wherein said insulative portion comprises a first insulative portion and a second insulative portion.

19. The high density contact socket of claim 10 wherein said means for creating a high speed transmission line environment comprises said plurality of holes being lined with a dielectric material that is surrounded by a conductive material and adapted for receipt of contact means for high speed signal transmission.

20. The high density contact socket of claim 10 wherein said means for creating a high speed transmission line environment comprises a compliant bus bar disposed in said holes having a plurality of compliant bus contacts and a plurality of signal contacts disposed at a selected distance from said compliant bus contacts.

* * * * *

UNITED STATES PATENT AND TRADEMARK OFFICE
CERTIFICATE OF CORRECTION

PATENT NO. : 5,205,742
DATED : April 27, 1993
INVENTOR(S) : Jay Goff, et al.

It is certified that error appears in the above-indentified patent and that said Letters Patent is hereby corrected as shown below:

Column 2, line 21, "contact 19 socket" should read --contact socket--.

Column 3, line 36, "printed 14 circuit" should read --printed circuit--.

Column 4, line 30, "support 66," should read --support 66'--.

Column 5, line 53, "the 15 alignment" should read --the alignment--.

Signed and Sealed this

Seventeenth Day of May, 1994

Attest:

BRUCE LEHMAN

*Attesting Officer*  *Commissioner of Patents and Trademarks*